United States Patent [19]

Tummala et al.

[11] Patent Number: 4,504,340
[45] Date of Patent: Mar. 12, 1985

[54] MATERIAL AND PROCESS SET FOR FABRICATION OF MOLECULAR MATRIX PRINT HEAD

[75] Inventors: Rao R. Tummala, Hopewell Jct.; Raj N. Master, Wappingers Falls, both of N.Y.

[73] Assignee: International Business Machines Corporation, Armonk, N.Y.

[21] Appl. No.: 517,533

[22] Filed: Jul. 26, 1983

[51] Int. Cl.$^3$ ............... C03B 29/00; C04B 33/34; C04B 37/00; B32B 31/00
[52] U.S. Cl. .................... 156/89; 156/252; 156/253; 156/220; 346/139 PC; 346/76 PH; 400/119
[58] Field of Search .......... 156/89, 252–253, 156/220; 400/119, 120; 346/139 C, 155, 76 PH

[56] References Cited

U.S. PATENT DOCUMENTS

| | | | |
|---|---|---|---|
| 2,830,867 | 12/1950 | Kohn | 346/165 |
| 3,192,086 | 6/1965 | Gyurk | 156/89 |
| 3,235,428 | 2/1966 | Naymik | 156/250 |
| 3,618,118 | 11/1971 | Lloyd | 346/165 |
| 3,624,661 | 11/1971 | Shebanon et al. | 346/155 |
| 3,693,185 | 9/1972 | Lloyd | 346/139 C |
| 3,898,674 | 8/1975 | Koch | 346/155 |
| 3,948,701 | 4/1976 | Fasbender | 156/701 |
| 3,948,706 | 4/1976 | Schmeckenbecker | 156/89 |
| 3,950,200 | 4/1976 | Moramoto et al. | 156/240 |
| 4,082,906 | 4/1978 | Amin | 156/89 |
| 4,104,345 | 8/1978 | Anderson et al. | 269/43 |
| 4,192,698 | 3/1980 | Maher et al. | 156/89 |
| 4,206,541 | 7/1980 | Sambucetti | 29/611 |
| 4,211,616 | 7/1980 | Sambucetti | 204/2 |
| 4,239,367 | 11/1980 | Herron et a. | 156/89 |
| 4,301,324 | 11/1981 | Kuman et al. | 174/68.5 |
| 4,345,955 | 8/1982 | Bakermans et al. | 156/89 |
| 4,371,273 | 2/1983 | Kendall et al. | 346/139 C |

OTHER PUBLICATIONS

IBM Technical Disclosure Bulletin, vol. 25, No. 7A, 12–82, pp. 3524–3526.
Kaiser et al., Solid State Technology, 5–72, vol. 15, No. 5, pp. 35–40.
IBM Technical Disclosure Bulletin (TDB), vol. 8, No. 10, 3–66, pp. 1307–1308.
IBM TDB, vol. 24, No. 10, 3–82, pp. 5072–5074.
IBM TDB, vol. 25, No. 7A, 12–82, pp. 3527–3528.

Primary Examiner—Edward Kimlin
Assistant Examiner—Merrell C. Cashion
Attorney, Agent, or Firm—Sughrue, Mion, Zinn, Macpeak, and Seas

[57] ABSTRACT

A method for fabricating a molecular matrix print head for use in nonimpact electrolytic printers. Green ceramic sheets are stacked and laminated, then embossed with insulators and screened with ruthenium dioxide. The assembly is then co-sintered at less than 1000° C. and the resulting structure smoothed by lapping and finished in a convention fashion.

9 Claims, 7 Drawing Figures

MATERIAL AND PROCESS SET FOR FABRICATION OF MOLECULAR MATRIX PRINT HEAD

BACKGROUND OF THE INVENTION

1. Field of the Invention

The present invention relates to a molecular matrix print head for use in a nonimpact printer.

2. Description of the Prior Art

In a well-known nonimpact printing system, information to be printed can be printed on an electrically sensitive ink impregnated recording material by applying an electric field representative of the information to be recorded to the electrically sensitive recording material by means of a printing head associated with the material. There is well known such a printing head including a substrate made of a material having a high resistivity, a plurality of electrodes selectively arranged on said substrate and connected with conductors for feeding the electric signal thereto.

In conventional methods for fabricating such a printing head, with the substrate being made of an insulating material such as ceramic or resin or silica, pin electrodes are provided on the substrate by imbedding fine wires in the substrate, or with the substrate being made of conductive material, electrode styli are provided on the substrate by imbedding fine wires enclosed in glass capillary tubes in the substrate.

It is also known to print conventional copper circuits on flexible printed circuit boards to form electrodes, and to mechanically fasten such boards together in a sandwich to form a print head. The physical dimensions of such a printing head require that the electrode styli formed have minute dimensions such as in the order of less than 0.23 millimeters. Conventional methods as mentioned above have the disadvantages that because of the small dimensions and close tolerances required, the print heads are difficult to fabricate, non-durable and expensive.

A relatively recent innovation in electronic packaging has been the development of the multilayer ceramic (hereinafter MLC) module. In this technology "green" sheets of ceramic powder held together by a temporary organic binder are metallized with a noble or refractory metal, usually, but not mandatorily, applied by screen printing. The metallized sheets are stacked, laminated and fired to form a monolithic ceramic-metal package. Details of MLC technology are given in Kaiser et al., Solid State Technology, May 1972, Volume 15, No. 5, pages 35-40, hereby incorporated by reference.

MLC Technology is well known. U.S. Pat. No. 4,082,906, to Amin, relates to a multilayer ceramic capacitor and process by which a green ceramic tape is cast and silkscreened with silver/palladium metal paste, after which the tape pieces are stacked and laminated to make a monolithic structure. The green chip is then sintered to achieve a fired monolithic multilayer ceramic capacitor.

U.S. Pat. No. 4,192,698, to Maher et al., discloses a method for preparing monolithic ceramic capacitors, including depositing a film of an electroding ink on the surface of each of a plurality of green ceramic layers, then making a stack of the green layers and firing the green ceramic body to mature the ceramic layers and transform the ink into metallic electrode films.

*IBM Technical Disclosure Bulletin,* Vol. 8, No. 10, March 1966, pages 1307 and 1308, discloses a paste useful in forming capillaries in multilayer ceramic structures. The capillary paste is comprised of a subliming solid that is volatile at or below the green ceramic sintering temperatures but not at the laminating temperature, a vehicle or solvent for the solids and a decomposable metallic resonate. The capillary forming paste is deposited by silk screening on separate green ceramic sheets, which are stacked upon one another and laminated. Upon sintering the laminated sheets fuse into an integral composite which does not disclose a discernible interface between sheets. A molten conductor can then be introduced into the openings formed, thus completing the electrical conductor path in the ceramic.

U.S. Pat. No. 3,235,428, to Naymik, refers to a method of fabricating a unitary array of individual wafers of semiconductor or like material uniformly and intimately bonded together but electrically insulated from each other. By this method, a plurality of semiconductor slices are bonded together using an insulating glass as the bonding medium to produce a bonded structure comprising layers of semiconductor materials separated by thin layers of insulating glass cement. This layered structure is then cut transversely into a series of slices which are again bonded together in similar fashion. The bonded structure is then cut a third time into slices with the result that a series of slices are produced, each of which is composed of an array of individual semiconductor wafers bonded together by a thin vitrious insulating film.

U.S. Pat. No. 3,950,200, to Muramoto et al., discloses a method of fabricating a thermoprinting head by printing a circuit pattern of resistive elements and electric conductors on one surface of a flat paper sheet, covering the circuit pattern and surface of the flat paper with a carrier layer of resin, peeling off the flat paper sheet, placing the remaining carrier layer carrying the circuit pattern over a surface of a preshaped insulating substrate with the circuit pattern being laid downward, and heating the carrier layer placed on the substrate to cause the carrier layer to be burned off and cause a circuit pattern to adhere to the surface of the substrate.

*IBM Technical Disclosure Bulletin,* Vol. 25, No. 7a, December, 1982, at pages 3527 and 3528, relates to a proposed integrated modular write head for nonimpact printers. The proposed write head described integrates the necessary printing elements and their control circuits and drivers in one package, by employing a suitable module technology, such as MLC. The integration of printing elements and any associated circuitry into a single print head unit containing all requisite elements, is made possible by the low energy, electrochemical printing technology.

A major object of the present invention is to provide a convenient and inexpensive method of fabricating a print head by means of the established multilayer ceramic technology.

SUMMARY OF THE INVENTION

The present invention provides an inexpensive and convenient way of fabricating a molecular matrix (MMP) print head. The use of established thick film technology substantially reduces manufacturing costs and improves product yield. The novel combination of MLC technology and established print head technology overcomes the difficulties of the prior art manufacturing process, e.g., dimensional tolerance and resolution and expense.

The major process steps of the present invention include the following:

First, perforating a predetermined pattern of holes on a standard grid pattern in a number of green ceramic sheets.

Second, screening the perforated green ceramic sheets with a electroding paste to fill the holes.

Third, stacking the green ceramic sheets with the filled holes in alignment and laminating the stacked sheets.

Fourth, embossing ceramic insulators on the surface of the green chip coaxial with the filled openings.

Fifth, applying a layer of ruthenium dioxide to the laminated assembly, substantially equal to the thickness of the embossed insulators.

Sixth, sintering the coated assembly at <1000° C. in air.

Seventh, lapping the surface of the sintered assembly to form a smooth unbroken surface.

It is emphasized that the above-described MLC technology and nonimpact print technology using multi-electrode print heads to print by means of electric current applied to papers coated with leuco dyes by means of a bromide catalyst are all conventional in the prior art. The present invention consists of the method of making conventional matrix printing heads for use in this process by using multilayer ceramic technology. The novelty of the present invention lies in using MLC technology to make a printing head in many separate layers of green ceramic substrate, which is laminated and then embossed with ceramic insulators and screened with electroding material and then cofired to produce a monolithic structure.

The advantage of this invention over the prior art is that by employing a green ceramic substrate which is dimensionally stable at low sintering temperatures, a suprisingly durable and inexpensive molecular matrix print head is easily manufactured by use of the known MLC technology.

DESCRIPTION OF THE PREFERRED EMBODIMENTS

Figure 7:
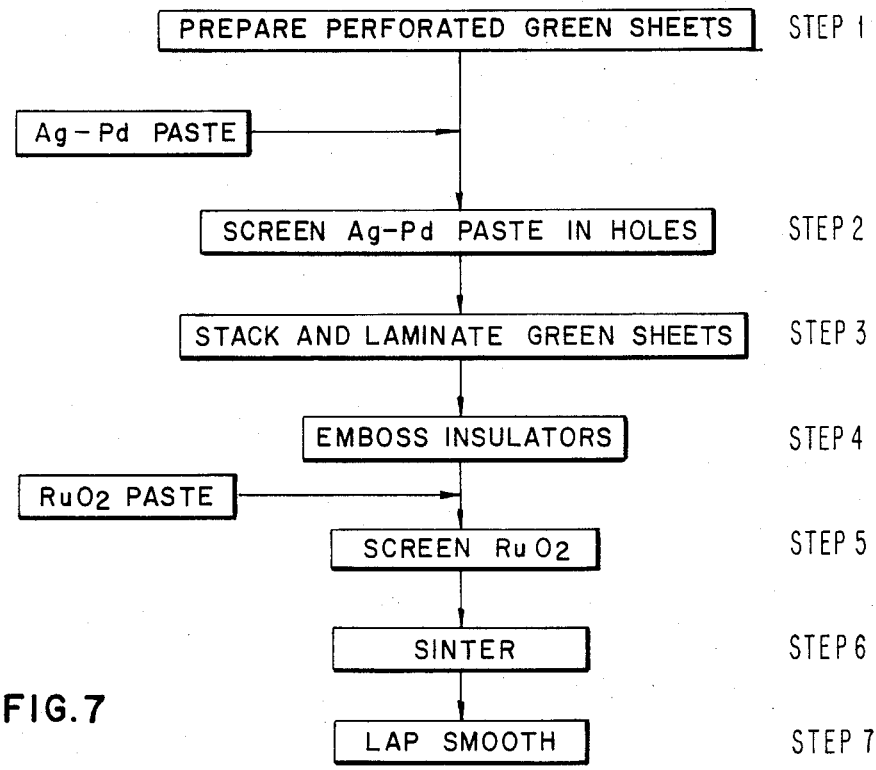
FIG. 7 is a flowchart showing steps of the process of the invention.

The invention will now be described in detail in connection with embodiments as shown in the accompanying drawings. According to the method of this invention, an MMP print head can be fabricated by the steps shown in FIG. 7. In Step 1, a green ceramic substrate is prepared. The ceramics selected for use in the present invention are not unduly limited, and can be freely selected from glass ceramic materials used in the prior art to form green unfired substrates. Preferred glass-type ceramics used in the present invention are cordierite or spodumene ceramics. Examples of such materials are disclosed in U.S. Pat. Nos. 4,234,367 to Herron et al. and 4,301,324 to Kumar et al.

The insulator employed should have well-defined features after embossing and sintering, and must possess sufficient strength to withstand lapping. The insulating substrate used should be sinterable below 1000° C. and sinter dense below 1000° C. The materials should have high viscosity at sintering temperatures, in order to maintain their features well defined.

Reference should be made to U.S. Pat. No. 4,192,698, Maher et al, earlier mentioned and also hereby incorporated by reference for disclosure regarding such.

The size of the ceramic used in the present invention is not overly important and is selected from those sizes that are conventionally used in the art. Typically, this is on the order of from about $1\mu$ to about $7\mu$, and this size range can be adjusted by conventional procedures such as ball or vibro-milling if desired or necessary, to reduce particle size.

As is well known in the art, green ceramic substrates are formed of a particular ceramic material in combination with a polymeric binder. The polymeric binder used in the present invention can be freely selected from those polymeric binders used in the prior art. Currently preferred green ceramic sheet binders for use in the present invention are polyvinyl butyral, polyvinyl formal, polyvinyl chloride, and polyvinyl acetate with a plasticizer such as dioctyl phthalate or dibutyl phthalate. Examples are seen in U.S. Pat. No. 4,104,345 to Anderson et al.

The molecular weight of the polymeric binder is not important and can be freely selected from molecular weights as are used in the prior art. Typically, this is on the order of about 30,000 to about 45,000 determined by the weight-average method. As one skilled in the art will appreciate, this is in no way limitative and it is only necessary that the polymeric binder permit easy formation of the slurry which is used to form the green ceramic substrate, provide sufficient strength so that green sheet may be appropriately handled during processing, and be easily volatilized during sintering to permit clean removal during formation of the fired ceramic substrates.

In the formation of green ceramic sheets, the only essential ingredients are particulate ceramic material and a polymeric binder illustrating the characteristics described above.

The slurry which is utilized to form the green ceramic sheet according to the present invention is typically formed using a solvent. The nature of the solvent is not important and is selected from those as are conventionally used in the art. Typical solvents include MIBK (Methyl Isobutyl Ketone) and methanol.

The slurry which is utilized to form the green ceramic sheet of the present invention contains proportions of the desired components as are conventional in the art. While by no means limitative, typically this will be from about 85 to about 94 wt.% ceramic particles, and from about 6 to about 15 wt.% polymer in the final green sheet. The range of solvents to solubilize into slurry form is from about 23 to about 35 wt.% of solvent based on slurry weight.

The slurry and the green ceramic sheet of the present invention are formed following conventional prior art procedures. Reference should be made to the Kaiser et al. article fully incorporated by reference and the U.S. Pat. No. 4,082,906, Amin et al., earlier mentioned and hereby incorporated by reference for disclosure regarding such.

Typically, however, the ceramic material is weighed out in the proper proportion, particle size is adjusted if desired or necessary, constituents of the organic binder such as the desired general plastic resin, a plasticizer and the solvents are separately blended, and then the ceramic paste and the organic paste are weighed out and blended in a ball mill. The resulting slurry (often called the slip) is cast into tape by doctor blading onto a web of Mylar ®, the blade spreading the slurry into a uniform film. After the slurry is spread out on a Mylar ® web, it is typically allowed to remain until enough of the solvent has evaporated so that the slurry will not flow when moved. The thus partially dried slurry is allowed to completely dry and is then removed from the Mylar ® backing and is ready for use in subsequent operations.

Since typically the green ceramic sheet at this time is rather large in size, working blanks are usually cut from the green ceramic sheet and holes are selectively punched in a uniform, standard grid pattern in the working blanks. The slip cast of green ceramic substrate is generally 0.025 to 0.38 mm thick, preferably 0.20 to 0.28 mm. The holes perforated in the green ceramic substrate are about 0.13 mm to about 0.25 mm in diameter.

In a Step 2, the holes 12 formed in the green sheet working blanks are filled by silk screening in a conventional manner using a smooth electroding ink. In general, the electroding material used to form connectors 13 must be compatible with an oxidizing sintering ambient. Preferred electroding materials include gold, silver, silver-platinum-palladium and gold-platinum-palladium pastes. Most preferred is a commercially available electroding paste containing a silver-palladium powder in a conventional organic binder system.

Figure 1:
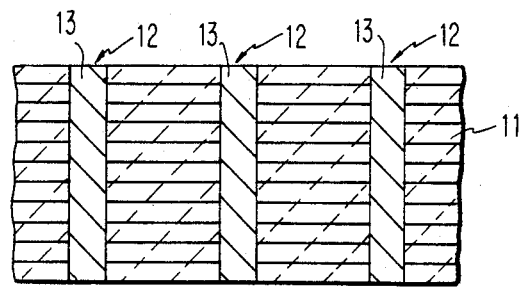
FIG. 1 shows a sectional view of a stack of green ceramic sheets with filled holes in alignment.
Figure 2:
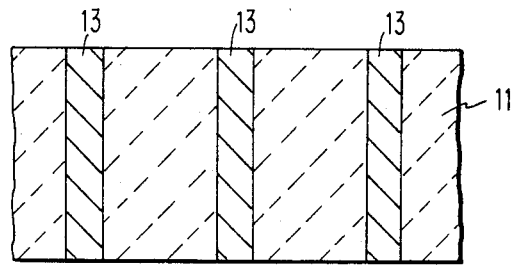
FIG. 2 shows the structure of FIG. 1 after lamination.

In Step 3, a stack of green ceramic blanks shown in FIG. 1 is formed which will become the final module. The stack of green ceramic blanks is aligned, generally by being stacked over registration pins, so that the filled holes 12 are in alignment. The stack is then placed in a laminating press and moderate heat and pressure are applied, e.g., typically from about 2500 to about 6000 PSI, preferably, 2900 to 4500 PSI, and about 75° C. to about 90° C., preferably, 71° C. to 73° C., for about 2 to about 5 minutes, whereupon the thermoplastic binder in the green sheet blank softens and the layers fuse together (FIG. 2), deforming around the filled holes 12 to completely enclose the electrodes 13.

Following the above procedure, in Step 4 a raised pattern of ceramic tori coaxial with the filled holes 12 is embossed on the top green ceramic layer of the laminated structure. The exact nature of the embossing is not overly important but typically embossing is performed by impressing the desired pattern into the top layer of green ceramic using a die.

Embossing conditions are not overly important, but typically, embossing will be done at a temperature at about 75° C. to about 90° C., preferably, 71° C. to 73° C., and typically at a pressure from about 500 to about 6000 PSI. Embossing and laminating can be performed in one step if desired. The ceramic tori thus embossed typically have an elliptical shape, having an outside diameter of from about 0.28 by 0.20 mm and an inside diameter of about 0.23 by 0.15 mm.

Figure 3:
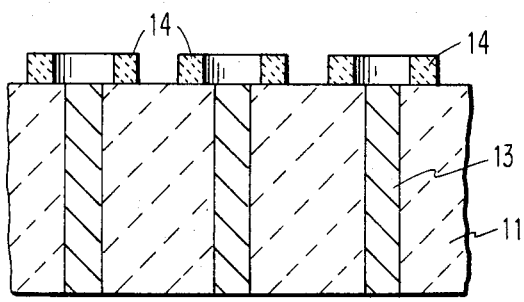
FIG. 3 shows the structure of FIG. 2 with green ceramic insulators deposited coaxially with the filled holes.
Figure 4:
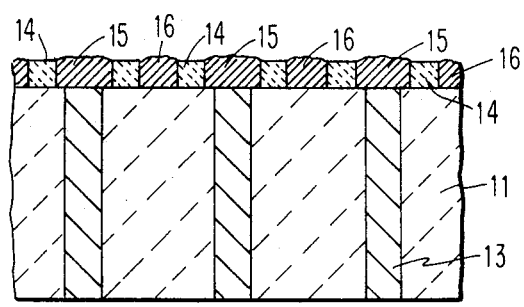
FIG. 4 shows the structure of FIG. 3 after it is screened with electrode material and sintered.
Figure 5:
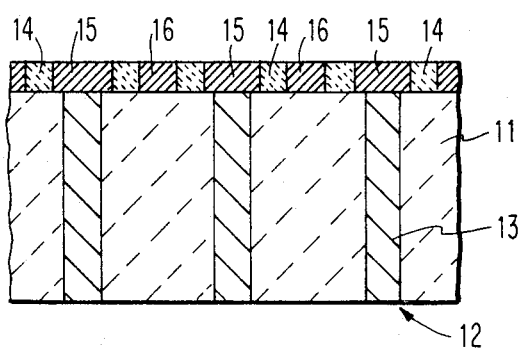
FIG. 5 shows the structure of FIG. 4 after its surface is smoothed by lapping.

In Step 5, an electrode material 16 is screened onto the top layer of the module, in a layer substantially equal in thickness to the embossed ceramic tori 14. As shown in FIG. 3, the electrode material is deposited both inside 15 and outside 16 the ceramic tori 14, which function as insulators for the individual electrodes.

Figure 6:
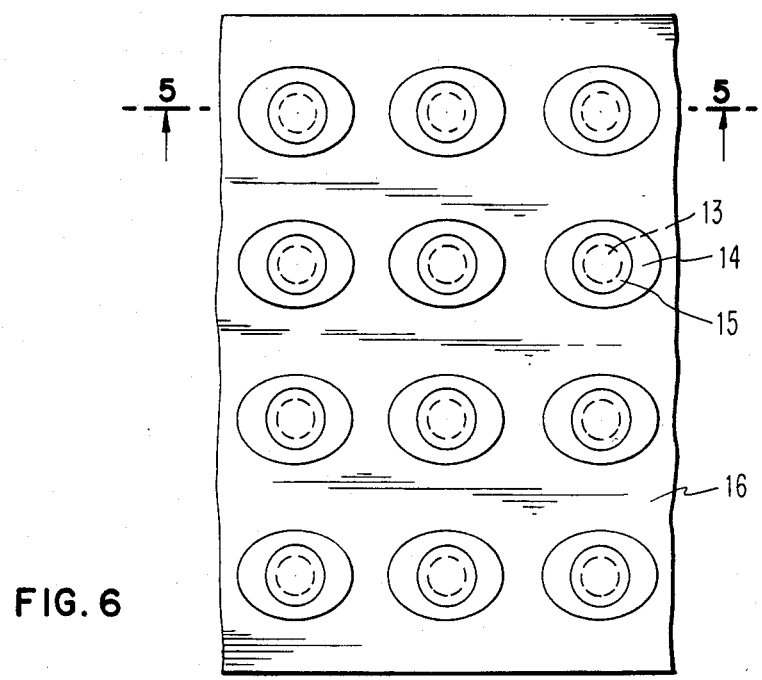
FIG. 6 is a top view of the finished print head.

The pattern of tori corresponds to the final electrode matrix pattern which is to be formed on the top ceramic blank of the MLC structure as shown in FIG. 6. As would be appreciated by one skilled in the art, the electrode material used must be essentially inert to avoid decomposition in the electrolytic printing reaction. It must, in addition, be a good conductor, be inexpensive, and have a dense surface. Preferably, ruthenium dioxide is used because its conductivity properties and resistance to corrosion when in contact with bromide ions used in the dye for printing, which are known to decompose even noble metal electrodes such as platinum. The ruthenium dioxide used to form the electrodes is formed by commercially available paste.

In Step 6, the ceramic module screened with ruthenium dioxide is sintered in air at from about 650° C. to about 950° C. for about 5 mins. to about 2 hours. The sintering temperature is preferably from about 850° C. to about 965° C. Furthermore, reducing ambients cannot be used since they will reduce the oxide to ruthenium metal which does not have resistance to corrosion by bromide ions. Therefore, oxidizing ambients must be used, preferably air. In the sintering step, the ruthenium dioxide is fused to the hard ceramic substrate and ceramic tori to form a unitary structure. Because of the character of the glass ceramic substrate used chip warpage and distortion may essentially be ignored.

The finished print head requires an extremely smooth surface, and therefore, in Step 7, the ruthenium dioxide electrodes and ceramic tori are finished by a lapping operation. The lapping method employed for use in the present invention is not unduly limited, and can be freely selected from lapping methods as have been used in the prior art. Typically, however, lapping is accomplished by use of a commercially available surface grinder. After the lapping operation of Step 7, the printing head has a smooth, unbroken surface with a pattern of electrodes formed by the ruthenium dioxide deposited inside the ceramic tori 14, insulated by the tori from a common ground plane 16 formed by the ruthenium dioxide in between the tori. The finished assembly is shown in FIG. 6.

The module is now ready for various post-sintering operations which are conventional in the art and which are disclosed in detail in the Kaiser et al. article earlier incorporated by reference, for example, pin brazing, chip joining, etc.

Having thus generally described the invention, the following working example is given to illustrate currently preferred best modes of practicing the invention.

EXAMPLE

In this example the final MLC structure includes 20 layers, each layer being 0.20 mm thick and having dimension of 1.5 mm by 13.2 inches. The ceramic frit used has the following composition: 50.6% $SiO_2$, 24.2% MgO, 21.2% $Al_2O_3$, 2.0% $P_2O_5$, and 2.0% $B_2O_3$. The average particle size thereof is $3\mu$. The binder selected is polyvinyl butyral and a plasticizer, e.g., dipropyl glycol dibenzoate. It has a molecular weight of 35,000 determined by the weight-average method. The solvent selected is MIBK and methanol. The ceramic frit, binder and solvent have proportions of 56 wt.%, 6.9 wt.%, and 37.1 wt.%, respectively, based on slurry weight. They are milled in a conventional fashion.

A green sheet having a thickness of 0.2 mm is produced from a slurry obtained using a conventional doctor blading method. The green sheet is then dried in air until solvents are evaporated. Thereafter, the same is cut into working blanks having dimensions of 185 by 185 mm, and registration holes are punched therein in a conventional manner. Thereafter, holes having a diameter of 0.13 mm are punched in identical standard grid patterns in each working blank. Following the above procedure, the holes are filled by a conventional silk screening technique using silver-palladium metallization paste. Thereafter, the working blanks are stacked on registration pins with the filled holes therein in alignment.

The green ceramic working blanks stack is then laminated at 72° C. for 5 min. After laminating, a pattern of unfired elliptical ceramic tori 0.10 mm thick and having an outside diameter of 0.28 by 0.20 mm and an inside diameter of 0.23 by 0.15 mm is embossed on the surface of the outermost green ceramic sheet coaxial with each filled hole by pressing the green laminated stack with a die containing the pattern of tori at 72° C. and 3500 PSI. The embossed green MLC intermediate is screened with a layer of ruthenium dioxide having a thickness of 0.10 mm which is substantially equal to that of the tori previously deposited. The ruthenium dioxide coated MLC intermediate is then sintered at 950° C. in an air ambient for 30 min. After cooling, the print head is finished to an extremely smooth surface by use of a surface grinder. The print head thus formed has discrete electrodes of ruthenium dioxide inside the ceramic tori and insulated by the ceramic tori from a common ground plane formed by the ruthenium dioxide in between the ceramic tori.

While there have been described what are presently considered to be the preferred embodiments of this invention, it will be obvious to those skilled in the art that various changes and modifications can be made therein without departing from the invention, and it is therefore intended to cover all such changes and modifications as are within the true spirit and scope of the invention.

We claim:

1. A method of making a matrix printing head comprising a plurality of discrete electrodes, the ends of which are coplanar with and insulated from a common ground plane, comprising the steps of:
   (a) perforating a plurality of unfired ceramic sheets with a predetermined pattern of holes;
   (b) filling the holes in each of said sheets with an electroding paste;
   (c) laminating said sheets with the filled holes therein in alignment;
   (d) forming a plurality of unfired ceramic tori raised from the surface of the outermost one of said sheets by embossing, said tori having upper surfaces raised above said electroding paste and being arranged coaxially with each of said filled openings;
   (e) applying a layer of a conducting material to the thus embossed surface of said outermost sheet so as to surround and fill said tori, said layer having a thickness substantially equal to that of the tori;
   (f) sintering the assembly; and
   (g) finishing the sintered assembly to form a smooth unbroken surface whereby a printing head having a plurality of discrete electrodes coplanar with and insulated from a common ground plane is formed.

2. The method of claim 1 wherein said conducting material comprises ruthenium dioxide.

3. The method of claim 2 wherein said electroding metal comprises silver-palladium.

4. The method of claim 1 wherein said ceramic sheets comprise glass-type ceramics.

5. The method of claim 1 wherein said glass-type ceramics comprise a material selected from the group consisting of cordierite and spodumene ceramics.

6. The method of claim 4 wherein said ceramic sheets are sintered at 650° C.–950° C.

7. The method of claim 4 wherein said ceramic sheets are sintered at 900° C.–950° C. for 5 min. to 2 hours.

8. The method of claim 2 wherein said ceramic sheets are sintered in an oxidizing ambient.

9. The method of claim 5 wherein said electroding metal comprises silver-palladium, said conducting material comprises ruthenium dioxide, and said assembly co-sintered in air at 900° C.–950° C. for 30 min. to 2 hours.

* * * * *